United States Patent [19]

Isobe et al.

[11] Patent Number: 4,939,695

[45] Date of Patent: Jul. 3, 1990

[54] VIRTUAL TYPE STATIC SEMICONDUCTOR MEMORY DEVICE INCLUDING REFRESH DETECTOR CIRCUITRY

[75] Inventors: Mitsuo Isobe, Yokohama; Takayasu Sakurai, Tokyo; Kazuhiro Sawada, Yokohama; Kazutaka Nogami; Hisashi Ueno, both of Kawasaki, all of Japan

[73] Assignee: Kabushiki Kaisha Toshiba, Kawasaki, Japan

[21] Appl. No.: 268,927

[22] Filed: Nov. 9, 1988

[30] Foreign Application Priority Data

Nov. 10, 1987 [JP] Japan ................................ 62-283702

[51] Int. Cl.⁵ ............................................. G11C 13/00
[52] U.S. Cl. .................................. 365/222; 365/233; 365/233.5; 365/230.01
[58] Field of Search ...................... 365/222, 233, 233.5, 365/230.01

[56] References Cited

U.S. PATENT DOCUMENTS

| | | | |
|---|---|---|---|
| 4,677,592 | 6/1987 | Sakurai et al. | 365/222 |
| 4,747,082 | 5/1988 | Minato et al. | 365/222 |
| 4,757,217 | 7/1988 | Sawada | 307/480 |
| 4,764,901 | 8/1988 | Sakurai | 365/189 |
| 4,807,289 | 2/1989 | Nakajima | 365/222 |
| 4,811,302 | 5/1989 | Koishi | 365/222 |

OTHER PUBLICATIONS

Nogami et al., "1-Mbit Virtually Static RAM," IEEE Journal of Solid-State Circuits, vol. SC-21, No. 5, Oct. 1986.

*Primary Examiner*—Terrell W. Fears
*Attorney, Agent, or Firm*—Finnegan, Henderson, Farabow, Garrett and Dunner

[57] ABSTRACT

A virtual type static semiconductor memory device according to the present invention comprises a refresh detector circuit for detecting the enabling operation of a refresh control circuit and a terminal for outputting to an outside a detection signal which is generated from the refresh detector circuit. The virtual type static semiconductor memory device informs a present refresh operation to the outside when it is accessed from the outside during the time period in which a refresh operation is conducted in the semiconductor memory device. A system employing the semiconductor memory device allows a slow access at that time only and allows access to be gained to the semiconductor memory device at high speed at other times.

4 Claims, 5 Drawing Sheets

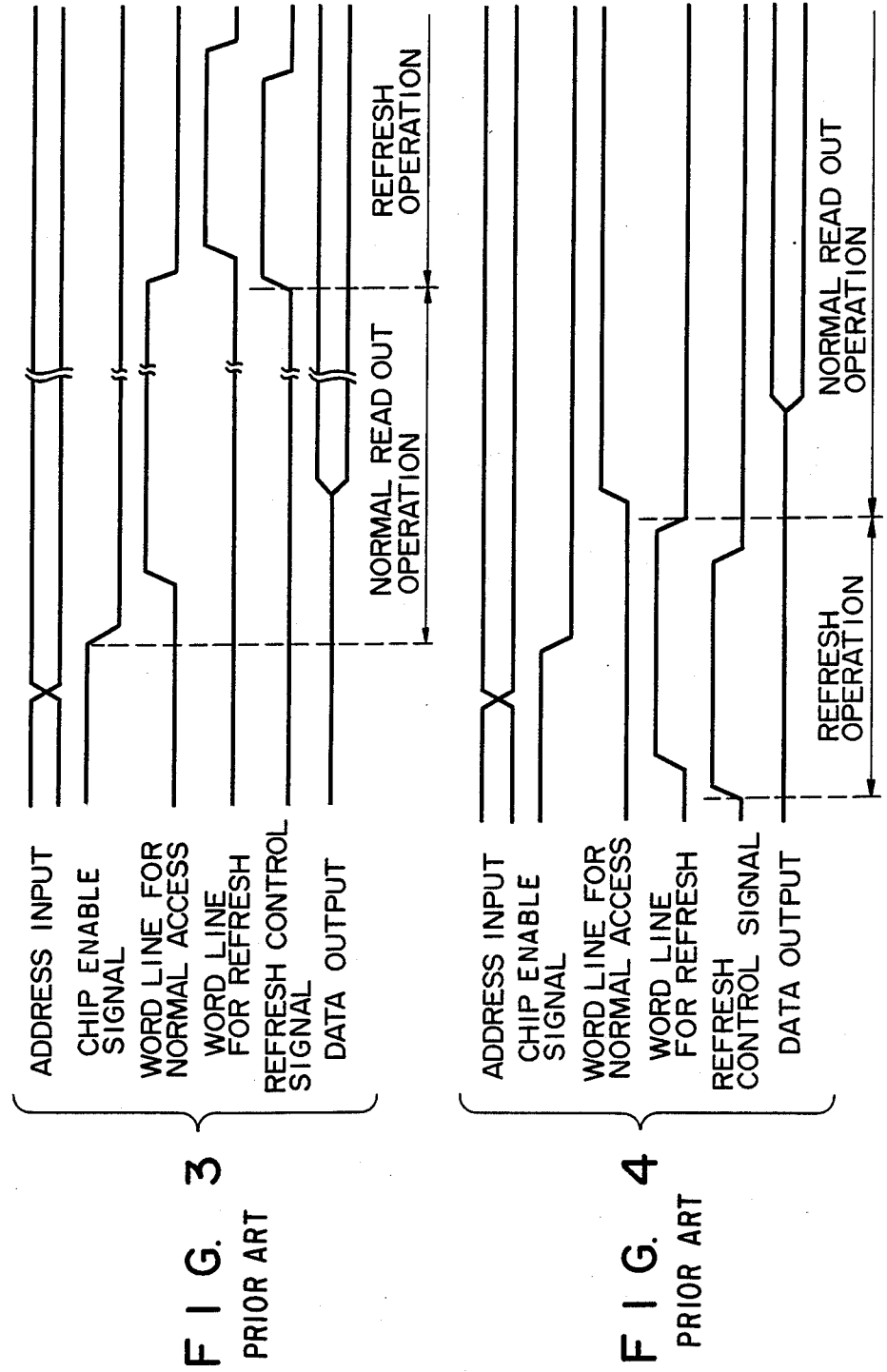

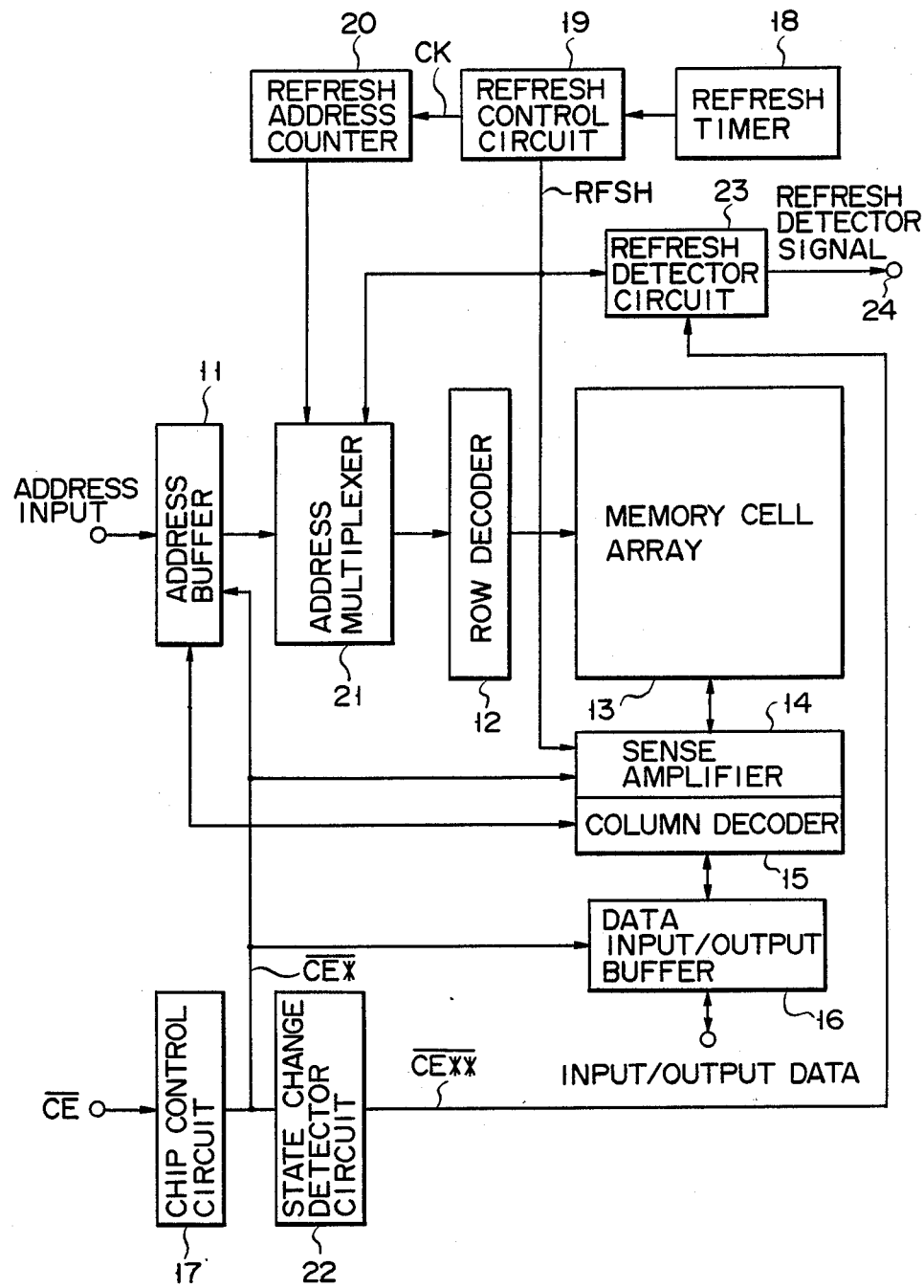
F I G. 5

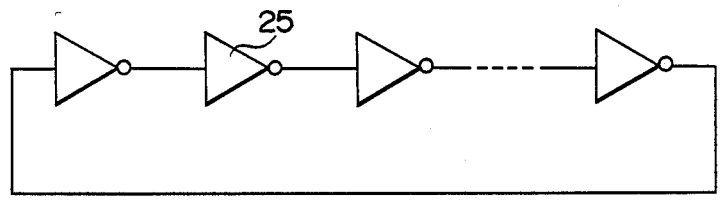
F I G. 8
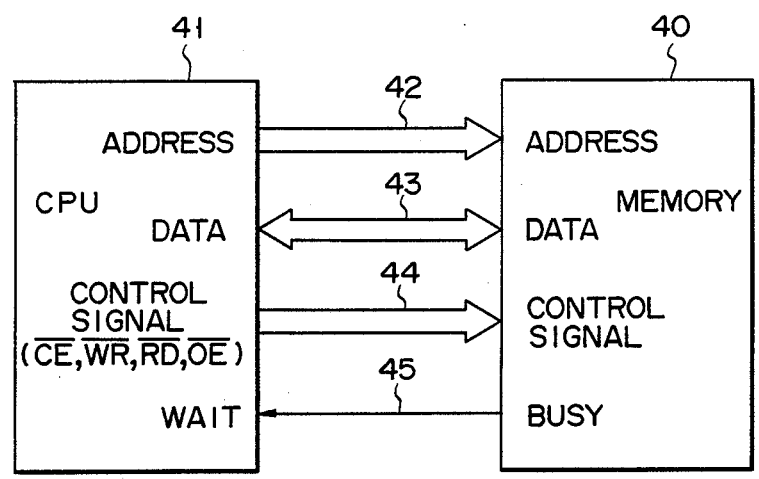
F I G. 9

VIRTUAL TYPE STATIC SEMICONDUCTOR MEMORY DEVICE INCLUDING REFRESH DETECTOR CIRCUITRY

BACKGROUND OF THE INVENTION

1. Field of the Invention

This invention relates to a virtual type static semiconductor memory device which employs dynamic memory cells and has the function of refreshing data in the memory cells.

2. Description of the Related Art

Recently a data write/read semiconductor memory device (RAM) has been increased in its capacity. Some semiconductor memory devices can store millions of data on a semiconductor chip as small as 1 mm$^2$/2. As a memory cell used as the smallest unit for storing one data, two types are known: a dynamic memory cell necessary to retain stored data and a static memory cell which retains data unless a power supply is interrupted. Six or four transistors and two resistors are necessary to constitute a static memory cell. On the other hand, the dynamic memory cell is constituted by, as shown in FIG. 1, one transistor 51 and one capacitor 52 for storing data as a charge. In FIG. 1, reference numeral 53 shows a word line for selecting a memory cell and 54, a bit line for supplying write data which comes from a selected memory cell. A dynamic RAM employing dynamic memory cells has an advantage in that a large capacity can readily be obtained due to a less number of component elements.

Recently a virtual type static RAM device has been proposed which eliminates the user's cumbersome operation, that is, a controlled refresh operation necessary to hold data in the dynamic RAM. This type of static RAM device can be employed as in the case of an "apparently easy-to-handle" static RAM device.

FIG. 2 is a block diagram showing an arrangement of a conventional virtual type static RAM device. This RAM device comprises address buffer 11 having a normal dynamic RAM, row decoder 12, dynamic memory cells of the type as shown in FIG. 1, sense amplifier 14, column decoder 15, data input/output buffer 16, chip control circuit 17, refresh timer 18, refresh control circuit 19, refresh address counter 20 and address multiplexer 21.

Refresh timer 18 generates a signal of a predetermined cycle. Refresh control circuit 19 enables a refresh control signal RFSH for each given cycle of a signal generated from timer 18 as well as a clock signal CK for performing an up-count or down-count each time a signal FSH is output relative to a row to be enabled. Refresh address counter 20 generates a refresh address by counting up or down the clock signal CK coming from refresh control circuit 19. Address multiplexer 21 selects a refresh address from refresh address counter 20 during the enabling of a refresh control signal RFSH and selects a refresh address to row decoder 12, and selects a normal address from address buffer 11 during the disabling period of the refresh control signal RFSH and supplies the normal address. The refresh control signal RFSH is supplied to sense amplifier 14. Sense amplifier 14 allows data which is read out from memory array 13 during the enabling of the signal RFSH to be amplified and again written into memory array 13.

FIGS. 3 and 4 are timing charts showing an operation of a conventional virtual type static RAM device as set out above.

As appreciated from the timing chart of FIG. 3, a chip enable signal $\overline{CE}$ as well as an address input external to the RAM is supplied to address buffer 11 during the time period in which the refresh control signal RFSH is not enabled or the internal refresh operation is not performed. By so doing, the RAM allows a read-out operation. In this case, an address received upon the enabling (a low level) of the chip enable signal $\overline{CE}$ is input from address buffer 11 to column decoder 15 and directly to address multiplexer 21. Since upon the enabling of the chip enable signal $\overline{CE}$ the refresh control signal RFSH is not enabled (a low level), address multiplexer 21 selects a normal address from address buffer 11 and supplies it to row decoder 12. Row decoder 12 selects a word line for normal access to an address corresponding to an address input. Upon the selection of the word line the data of the memory cell connected to the selected word line is read onto sense amplifier 14 where that data signal is amplified. Of data from the memory cells which are amplified by sense amplifier 14, only that data selected by column decoder 15 is delivered as output data relative to the RAM via data input/output buffer 16.

When a refresh control signal RFSH is enabled (a high level) by refresh control signal RFSH after the completion of the reading of the data from the memory cell, address multiplexer 21 allows a refresh address which is generated at refresh address counter 20 to be delivered to row decoder 12. Row decoder 12 selects an enable word line associated with the refresh address in memory cell array 13. The data which is stored in the memory cell associated with the word line is supplied to sense amplifier 14 for a refreshing operation to be operated. That is, the data signal is amplified by sense amplifier 14 and then the amplified data signal is written again into the original memory cell in array 13. After the completion of the refreshing operation, the refresh control signal RFSH is disabled and chip enable signal $\overline{CE}$ is again enabled, placing address buffer 11 in readiness for the next normal access input signal. Since the data which is amplified by sense amplifier 14 at the time of the aforementioned refresh operation need not be delivered relative to the RAM, data input/output buffer 16 continues outputting the data during the making of the refresh operation preceding the refresh operation.

As appreciated from the timing chart of FIG. 4, the fresh control signal RFSH is already enabled in the start of a normal access operation by the RAM on the basis of the address input and chip enable signal $\overline{CE}$. When the normal access operation is performed with the refresh control signal RFSH already enabled in the operation of the normal access operation and with the refresh operation interrupted in the making of the refresh operation, then the refresh operation is unfinished and hence the data already stored in the memory cell is changed into different data, causing the RAM to operate erroneously. In the case where the refresh control signal RFSH is already enabled upon the making of the normal access operation, the refresh operation is performed to the end. In place of the enable word line, a word line for normal access to the address represented by the address input is selected, after the completion of the refresh operation, and then a normal read operation is carried out. It is to be noted that the enable word line as well as the word line for normal access is selected as the word line, but that these word lines are exactly of the same type.

In the conventional RAM device, if the refresh operation is already performed when a normal access operation is to be performed, the normal access operation has to be delayed until the refresh operation is completed. At this time, the normal access time will be delayed by an extent corresponding to the refresh operation. Let it be assumed that, for example, an access time is 100 nano-seconds when the normal access operation is performed with the refresh operation not done. If, on the other hand, the normal access operation is performed with the refresh operation done, then the access time will be 150 nano-seconds at max. provided that 50 nano-seconds are required for refresh operation. Since the cycle of the refresh timer in general upon using the dynamic memory timer may be about 100 microseconds, the probability of the timing in which the refresh operation is finished upon the normal access operation will be 50 nano-seconds/100 micro-seconds = 1/2000. However, the speed of the system using the RAM needs to be set at 150 nano-seconds, a time corresponding to the worst time of the RAM. That is, the aforementioned operation is performed at a rapid speed of 100 nano-seconds at 1999 times out of 2000 times while, on the other hand, it is performed at a slow speed of 150 nano-seconds once out of 2000 times. It is, therefore, necessary to design the system such that all the associated access time be set to 150 nano-seconds.

As appreciated from the above, the conventional virtual type static semiconductor memory device has the disadvantage in that the whole system's speed is determined by the slow access time as set out above in connection with the probability.

SUMMARY OF THE INVENTION

It is accordingly the object of the present invention to provide a virtual type static semiconductor memory device which enhances the operation speed of a whole system.

A virtual type static semiconductor memory device of the present invention comprises a refresh detection circuit for detecting a present refresh operation of a refresh control circuit and for generating a detection signal and a terminal for outputting to an outside a detection signal which is generated from the refresh detection circuit.

The virtual type static semiconductor memory device of the present invention informs to an outside a present refresh operation when it is accessed from an outside during a time period in which the refresh operation is done in the semiconductor memory device. A system employing the semiconductor memory device allows a slow access at that time only and a rapid access at the other times.

BRIEF DESCRIPTION OF THE DRAWINGS

FIG. 3 is a timing chart showing the read operation of a random access memory upon the application of an address input and chip enable signal during a period of time in which no internal refresh operation is performed in the conventional virtual type static random access memory;

FIG. 4 is a timing chart showing the case where the internal refresh operation is finished upon the making of the normal access operation in the conventional virtual type memory of FIG. 2;

FIG. 5 is a block diagram showing a virtual type static random access memory of the present invention;

FIG. 8 is a detailed circuit diagram showing a refresh timer in the virtual type static random access memory of FIG. 5; and FIG. 9 is a block diagram showing a CPU system using the virtual type static random access memory of the invention of FIG. 5.

DETAILED DESCRIPTION OF THE PREFERRED EMBODIMENTS

A virtual type static semiconductor memory device according to an embodiment of the present invention will be explained below by referring to the accompanying drawings.

FIG. 5 is a block diagram showing a whole arrangement of a virtual type static memory device (a virtual type static RAM) according to the present invention.

Figure 1:
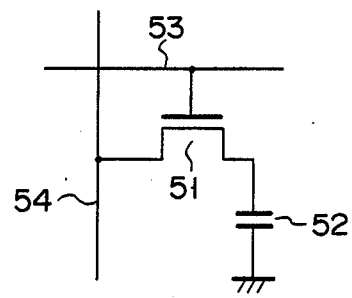
FIG. 1 is a schematic diagram showing a normal dynamic memory cell.
Figure 2:
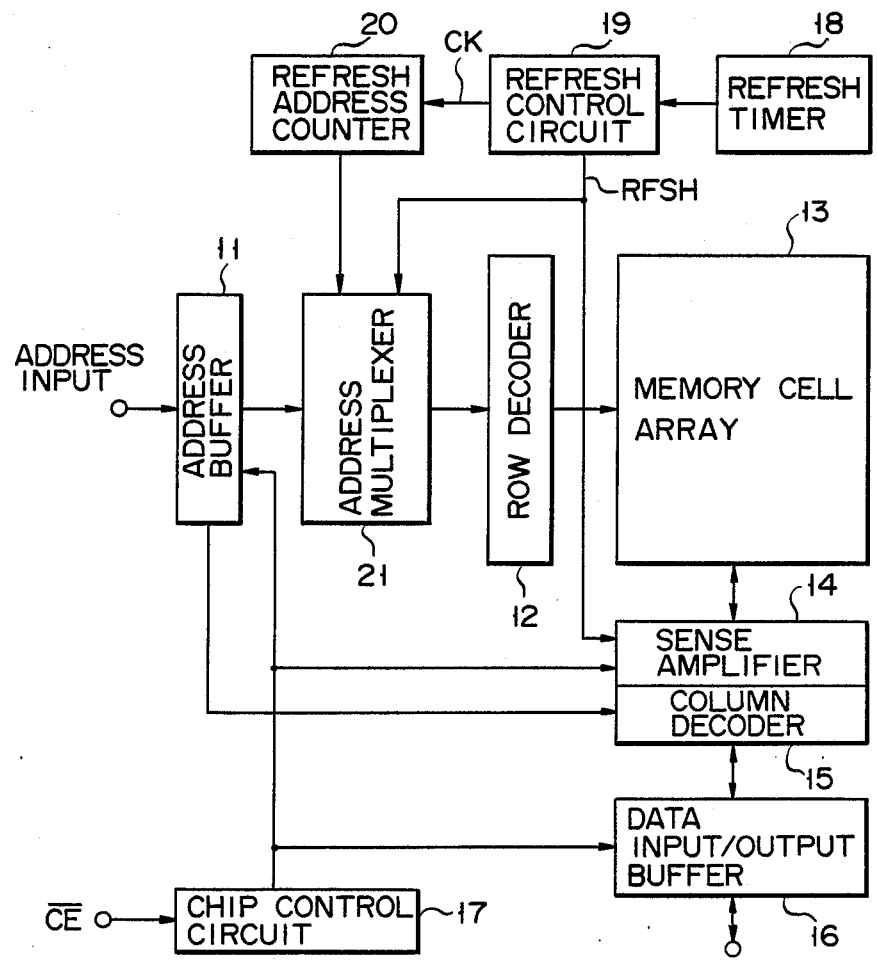
FIG. 2 is a block diagram showing a conventional virtual type static random access memory device.

The aforementioned static memory device comprises address buffer 11, row decoder 12, memory cell array 13 constituted by dynamic memory cells of such a type as set forth in FIG. 1, sense amplifier 14, column decoder 15, data input/output buffer 16, chip control circuit 17, refresh timer 18, refresh control circuit 19, refresh address counter 20 and address multiplexer 2 as well as static change detector circuit 22, refresh detector circuit 23 and output terminal 24 for a refresh detection signal.

Change state detector circuit 22 is adapted to detect the state change of an internal chip enable signal CE* which is received from chip control circuit 17 and is in phase with an external chip enable signal CE. Detector circuit 22 enables an internal signal CE** subsequent to changing the signal CE* from a high to a low level. The enabling time of the internal signal CE is set equal to, or somewhat shorter than, the access time as involved upon the write operation of the normal data. The signal CE is input to refresh detector circuit 23. The refresh control signal RFSH is supplied to refresh detector circuit 23 and refresh detector circuit 23 is enabled by the a refresh control signal and generates a refresh detection signal during the enabling of the signal $\overline{CE^{**}}$ only. The refresh detection signal is delivered to an outside circuit, such as a RAM, via terminal 24.

The operation of the aforementioned semiconductor memory device will be explained below with reference to a timing chart.

Figures 6, 7:
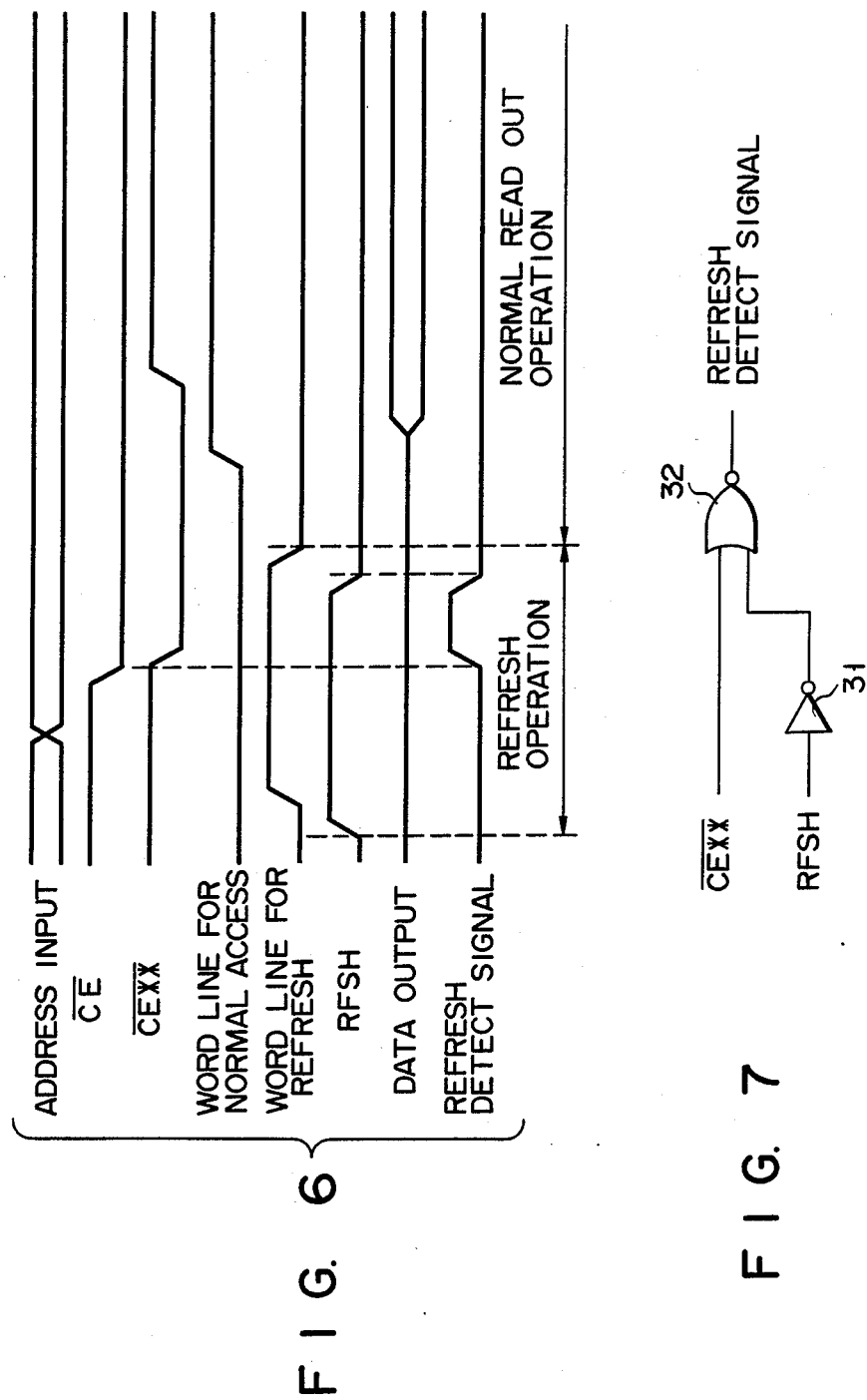
FIG. 6 is a timing chart showing the case where an internal refresh operation is already finished in the start of the normal access operation in the virtual type static random access memory of the present invention.
FIG. 7 is a detailed circuit diagram showing a refresh detector circuit in the virtual type static random access memory of the present invention.

FIG. 6 shows the operation of the RAM in the case where, in the case of FIG. 4, the refresh control signal RFSH is already completed at the time of a normal access operation based on an address input and chip enable signal $\overline{CE}$. Even if the refresh control signal RFSH is enabled prior to the making of the normal access operation and then the chip enable signal $\overline{CE}$ is enabled during the time portion of the refresh operation, a refresh operation now involved is performed to the end. After the internal chip enable signal CE* is enabled with the signal $\overline{CE}$ enabled, it is detected by state change detector circuit 22 where the signal $\overline{CE^{**}}$ is enabled at which time a refresh operation is carried out. The refresh detector circuit 23 detects the refresh operation to enable a refresh detection signal. The refresh detection signal is input to the external device via terminal 24. The external device can recognize the refresh operation based on the enabling of the refresh detection signal. In this case, the external device delays the writing of the data from the RAM.

When the refresh control signal RFSH is disabled subsequent to the completion of the refresh operation at the RAM, refresh detector circuit 23 disables a refresh detection signal. Thereafter, a normal write operation is started as in the conventional semiconductor memory device and the write data is input to an external device via data input/output buffer 16.

When the refresh operation is started upon the disabling of the chip enable signal $\overline{CE}$, it is not necessary to deliver a refresh detection signal from refresh detector circuit 23 to an outside. Since at this time the signal $\overline{CE^{**}}$ from state change detector circuit 22 is not enabled, the refresh detector signal is not enabled.

Furthermore, even if the refresh operation is started subsequent to the normal access operation as shown in the timing chart of FIG. 3, it is not necessary to deliver a refresh detection signal to the outside. Since in this case the enabling time of the signal $\overline{CE^{}}$ from state change detector circuit 22 is set equal to, or somewhat shorter than, the access time involved at the normal data write operation, the chip enabling signal $\overline{CE}$ is enabled and the enabling time of the signal $\overline{CE^{}}$ is completed before the termination of a time period in which the word line for normal access is selected. As a result, the refresh detection signal is not enabled at refresh detection circuit 23.

In the aforementioned semiconductor memory device, a refresh detection signal representing the current performance of the refresh operation is output to the outside only when the refresh operation is made prior to the normal access. The system using the aforementioned semiconductor memory device determines whether or not the refresh detection signal is enabled. The system can delay its speed only upon the enabling of the refresh detection signal and advance its speed upon the disabling of the refresh detection signal.

As already set out above, it has been necessary to delay the whole operation speed at the aforementioned conventional semiconductor memory device due to a slow operation occurring at a probability of once out of 2000 times. According to the present invention, it is possible to operate the system at high speed at 1999 times out of 2000 times except in the case where the aforementioned access time is delayed only when the refresh operation is performed prior to the normal access operation which occurs once out of 2000 times on the system.

FIG. 7 shows one practical form of refresh detection circuit 23 in the aforementioned embodiment. The circuit is constituted by inverter 31 for inverting a refresh control signal RFSH and NOR circuit 32 for receiving an output of inverter 31 and a signal $\overline{CE^{**}}$. A refresh detection signal is output from NOR gate circuit 32.

In the aforementioned semiconductor memory device, refresh timer 18 can be implemented by a ring oscillator loop 18 comprised of a closed loop with, for example, an odd number of inverters 25 as shown in FIG. 8 or by a transition detector for detecting a rise or a fall of an output from timer 18. Refresh address counter 20 can be implemented by a cascade-connection of trigger type flip-flops. State change detector circuit 22 can be achieved, by a transition detector, which detects the state change of an internal chip enable signal $\overline{CE^*}$ and enables the signal $\overline{CE^{**}}$ after the signal $\overline{CE^*}$ has been changed from a high to a low level.

FIG. 9 is a block diagram showing an arrangement of a CPU system using the semiconductor memory device of the present invention. In FIG. 9, reference numeral 40 shows a memory made up of a plurality of virtual type static RAMs. Memory 40 delivers a refresh detection signal as a busy signal BUSY. Reference numeral 41 is a CPU for gaining access to memory 40. CPU is connected to memory 40 via address bus 42, bi-directional data bus 43 and control signal bus 44 for various control signals, such as a chip enable signal $\overline{CE}$, write control signal $\overline{WR}$, read control signal RD and output enable signal $\overline{OE}$. The busy signal BUSY of memory 40 is connected to wait terminal WAIT via busy signal line 45.

The CPU system of FIG. 9 is operated as set out below. CPU 41 enables a chip enable signal $\overline{CE}$ for access to memory 40. In this case, since a plurality of RAMs are provided within memory 40, CPU 41 selectively enables only an enable signal $\overline{CE}$ corresponding to a RAM in memory 40 which is to be accessed. Receiving the chip enable signal $\overline{CE}$, RAM has already started the refresh operation and outputs a busy signal BUSY if that operation has not yet been completed. CPU 41 delays the writing of data upon receipt of the busy signal BUSY at the wait terminal WAIT via busy signal line 45. CPU 41 reads data from memory 40 via bi-directional data bus 43 after the busy signal BUSY ceases to be received from memory 40. The probability of the occurrence of that event is, for example, once out of 2000 times as already set out above. At the other times, that is, 1999 times out of 2000 times, RAM can provide access to data with a minimum access time since no busy signal BUSY is input upon the outputting of the chip enable signal $\overline{CE}$.

The present invention can be changed or modified in a variety of ways without being restricted to the aforementioned embodiment. Although, in the aforementioned embodiment, the refreshing operation of the memory cell array has been explained as being performed at each cycle of a refresh timer in RAM, the system may detect a data leak state at a capacitor of the memory cell and start a refresh operation based on a result of detection.

What is claimed is:

1. A virtual type static semiconductor memory device comprising:

a memory cell array including a plurality of memory cells;

decoding means for selecting a desired one of said memory cells;

chip control means for generating an internal signal; and refresh controlling means including a refresh timer which generates a multicycle time signal, refresh control circuit means for generating a refresh control signal for each cycle of the time signal and for generating a clock signal, refresh address counter means for generating a refresh address by counting said clock signal and for outputting the refresh address to said decoding means, and refresh detector circuit means for outputting a refresh detection signal only upon determining when the refresh control signal is enabled prior to the enabling of the internal signal, said refresh detection signal employed to delay the access of said memory cells in a normal access mode.

2. A virtual type static semiconductor memory device according to claim 1, wherein said refresh detector circuit means includes means for outputting said refresh detection signal only when it receives said refresh control signal and said internal signal enabled subsequent to a change in level of a chip enable signal generated external to said memory device.

3. A virtual type static semiconductor memory device according to claim 2, wherein an enabling time of said internal signal is set equal to, or somewhat shorter than, a normal access time.

4. A virtual type static semiconductor memory device according to claim 2, wherein said refresh detector circuit means includes an inverter which inverts said refresh control signal to obtain an inverted signal and a NOR gate circuit connected to receive said inverted signal from said inverter at one input terminal and said internal signal at another input terminal.

* * * * *